(12) United States Patent
Neckmar et al.

(10) Patent No.: US 11,340,272 B2
(45) Date of Patent: May 24, 2022

(54) APPARATUS AND METHOD FOR DETERMINING A POWER VALUE OF A TARGET

(71) Applicant: ElectDis AB, Malmö (SE)

(72) Inventors: Martin Neckmar, Bara (SE); Laurens Swaans, Malmö (SE); Magnus Wikstrand, Limhamn (SE)

(73) Assignee: ElectDis AB, Malmö (SE)

( * ) Notice: Subject to any disclaimer, the term of this patent is extended or adjusted under 35 U.S.C. 154(b) by 277 days.

(21) Appl. No.: 16/608,125

(22) PCT Filed: Apr. 25, 2018

(86) PCT No.: PCT/EP2018/060579
§ 371 (c)(1),
(2) Date: Oct. 24, 2019

(87) PCT Pub. No.: WO2018/197553
PCT Pub. Date: Nov. 1, 2018

(65) Prior Publication Data
US 2020/0049744 A1    Feb. 13, 2020

(30) Foreign Application Priority Data

Apr. 26, 2017   (EP) .................................. 17168313

(51) Int. Cl.
*G01R 21/02* (2006.01)
*G01R 21/133* (2006.01)

(52) U.S. Cl.
CPC ........... *G01R 21/02* (2013.01); *G01R 21/133* (2013.01)

(58) Field of Classification Search
CPC ...... G01K 17/00; G01K 7/30; G01K 2217/00; G01K 3/005; G01K 17/08; G01K 7/02;
(Continued)

(56) References Cited

U.S. PATENT DOCUMENTS 3,813,937 A * 6/1974 Fletcher ................. G01K 17/04
374/34
4,223,264 A * 9/1980 Yamamura ............. G01R 21/02
324/106

(Continued)

FOREIGN PATENT DOCUMENTS

CN      2 831 066 Y    10/2006
CN     101568814 A    10/2009
(Continued)

OTHER PUBLICATIONS

National Intellectual Property Administration, PRC, Search Report, Application No. 2018800420786, dated Aug. 30, 2021, 2 pages.
(Continued)

*Primary Examiner* — Vinh P Nguyen
(74) *Attorney, Agent, or Firm* — Honigman LLP (57) ABSTRACT

An apparatus and a method for determining a power value of a target in the form of an AC circuit (130; 230; 330) having an AC power source (132; 232; 332). The method involves operating (72) a controllable DC power source (12) to provide DC power to a DC circuit (10; 110; 210; 310) and measuring (73) at least one thermal parameter related to power dissipation of the DC circuit (10; 110; 210; 310) and of the target AC circuit (30; 130; 230; 330), wherein at least one heat sink (160a, 160b; 260; 360) is thermally coupled between the DC circuit (10; 110; 210; 310) and the target AC circuit (30; 130; 230; 330). The method further involves controlling (74) the DC power source (12) based on the measured at least one thermal parameter to reduce a difference in power dissipation between the DC circuit (10; 110; 210; 310) and the target AC circuit (30; 130; 230; 330). The method then involves, when thermal equilibrium is reached (75), determining the power value (49) of the target AC circuit (30; 130; 230; 330) by retrieving (76) at least one real-time measurement of at least one electric parameter of
(Continued)

the DC circuit (10; 110; 210; 310), calculating (77) a DC power value of the DC circuit (10; 110; 210; 310) based on the retrieved at least one real-time measurement of the at least one electric parameter, and calculating (78) the power value (49) of the target AC circuit (30; 130; 230; 330) using the calculated DC power value.

17 Claims, 6 Drawing Sheets

(58) Field of Classification Search
CPC .......... G01K 3/04; G01K 15/007; G01K 7/16; G01K 13/12; G01K 7/01; G01K 3/10; G01K 7/00; G06F 1/20; G06F 2119/08; G06F 11/3058; G06F 11/3409; G06F 1/189; G06F 1/3234; G05B 19/406; G05B 23/0275; G05B 19/414; H01L 35/00; H01L 23/38; H01L 2924/351; H01L 28/20; H01L 2225/06589; H01L 23/345; H01L 23/373; G01R 21/02; G01R 21/133

See application file for complete search history.

(56) References Cited

U.S. PATENT DOCUMENTS

| | | | |
|---|---|---|---|
| 4,255,961 A | 3/1981 | Biltonen et al. | |
| 5,188,286 A * | 2/1993 | Pence, IV | G05D 23/27535 236/1 F |
| 5,288,147 A | 2/1994 | Schaefer et al. | |
| 5,439,291 A | 8/1995 | Reading | |
| 5,657,257 A * | 8/1997 | Lee | G06F 1/3215 713/321 |
| 6,000,829 A * | 12/1999 | Kurokawa | H03K 19/00384 327/121 |
| 9,158,358 B2 * | 10/2015 | Park | G06F 1/3206 |
| 2005/0190813 A1 | 9/2005 | Schick | |
| 2008/0071494 A1 | 3/2008 | Reading | |
| 2013/0027110 A1 | 1/2013 | Beale et al. | |
| 2014/0004810 A1 | 1/2014 | Cohen et al. | |
| 2016/0211880 A1 | 7/2016 | Choi et al. | |

FOREIGN PATENT DOCUMENTS

| | | |
|---|---|---|
| CN | 103339773 A | 10/2013 |
| CN | 104865988 A | 8/2015 |
| CN | 104 914 299 A | 9/2015 |
| EP | 0 001 707 A1 | 5/1979 |
| EP | 0 962 763 A1 | 12/1999 |
| EP | 2 133 690 A1 | 12/2009 |
| EP | 2911191 A2 | 12/2014 |
| JP | S4967674 B2 | 7/1974 |
| JP | H03110481 A | 4/1993 |
| JP | 2011250682 A | 12/2011 |
| WO | 2008078271 A1 | 7/2008 |
| WO | 2012025664 A1 | 3/2012 |

OTHER PUBLICATIONS

National Intellectual Property Administration, PRC, Office Acton, Application No. 2018800420786, dated Sep. 3, 2021, 15 pages.
International Search Report and Written Opinion of PCT/EP2018/060579, dated Jul. 10, 2018.
International Preliminary Report on Patentability of PCT/EP2018/060579, dated Aug. 5, 2019.
Keysight Technologies, "Achieving Accurate E-band Power Measurements with E8486A Waveguide Power Sensors" (Aug. 4, 2014): available at URL http://literature.cdn.keysight.com/litweb/pdf/5991-3776EN.pdf.
Extended European Search Report of EP17168313.9, dated Nov. 7, 2017.
JPO; App. No. 2019-558435; Notice of Reasons For Rejection dated Mar. 8, 2022.

* cited by examiner

APPARATUS AND METHOD FOR DETERMINING A POWER VALUE OF A TARGET

CROSS-REFERENCE TO RELATED APPLICATIONS

This application is a 35 USC § 371 United States national stage application of International Application No. PCT/EP2018/060579, filed Apr. 25, 2018, which claims priority to European Patent Application EP17168313.9, filed Apr. 26, 2017.

TECHNICAL FIELD

The present invention generally relates to the field of electronic measurement equipment, and more particularly to an apparatus for determining a power value of a target. The present invention also relates to an associated method of determining a power value of a target.

BACKGROUND

Various approaches for determining a power value of a target have been presented in the prior art. For certain types of targets, such as a target in the form of a DC circuit which includes a DC power source, quite accurate measurement methods exist. Some of these measurement methods operate by measuring a real-time voltage value and/or a real-time current value by using one or more precision resistors, and then calculating a power value by using Ohm's law.

For other types of targets, such as an AC circuit which includes an AC power source, it is a lot more challenging to achieve comparable measurement accuracy. In one prior art attempt, AC and DC measurements are compared together sequentially. First, a temperature increase of a power sink is measured with DC input (calibration phase). Then AC input is applied, and the resulting temperature increase is compared to the DC input. Theoretically, a fully calibrated load can be characterized in terms of temperature increase, and a look-up table could seemingly be created that relates a certain temperature increase to a certain power level. However, such a solution would require that the thermal/electrical model does not change over time (no comparisons are made in real-time). In real-world applications, power dissipation will vary over time, mainly by the self-heating of the components. This is a very difficult factor to predict and will limit the accuracy of any such solution to a few percent.

Another prior art attempt measures AC voltage and current and multiply the measured values to acquire instantaneous power. Averaging of that value will result in the real power. These measurements will have to rely on high-speed high-accuracy ADC (analog/digital converter) samplers. Also the phase difference between voltage and current measurements will have to be taken into account, since it will change the average power (because a phase shift will result in a small negative power whenever either voltage or current is negative while the other is still positive; this is something that does not happen in a resistive load). Moreover, the accuracy of the sampling will be reduced once the frequency of the AC signal increases. A 24-bit ADC can achieve high resolution when the sampling frequency is low enough, but when approaching higher sampling frequencies the Effective Number Of Bits (ENOB) will be reduced significantly. In addition to that, practical applications do not include signals where the AC part is purely sinusoidal, meaning it contains higher harmonics that need to be taken into account (i.e., measured accurately) when measuring power, since they contribute to the total power dissipation. This puts another limit on the accuracy of such a prior art measurement system.

Circuits might be added to facilitate filtering, and compensation and correction of errors, but such additional circuits would bring extra uncertainties and influences on the measured quantity. So, by improving for example the averaging, the filter components would add to the overall circuit uncertainty, thereby making it difficult to obtain a high accuracy of the measurement results.

The present inventors have hence realized that there is room for improvements in these fields.

SUMMARY

It is accordingly an object of the invention to eliminate, alleviate, mitigate or reduce at least some of the problems referred to above, by providing an improved apparatus and method for determining a power value of a target in the form of an AC circuit having an AC power source.

The present inventors have realized, after insightful consideration, that the power value of a target AC circuit can be determined by transforming the energy from an AC power source in the target AC circuit into heat and measuring the power dissipation, while at the same subjecting a DC circuit to DC power and measuring the power dissipation resulting therefrom. At least one heat sink should be thermally coupled between the DC circuit and the target AC circuit to improve the accuracy of the power dissipation measurements and, in particular, isolate the measurement of the power dissipation of the DC circuit from the measurement of the power dissipation of the AC circuit. By seeking a (real-time) balance between the temperatures caused by the power dissipations, a real-time determination of a DC power value of the DC circuit may be done and used as a DC power equivalent of the power value of the target. As long as the balance is maintained, the DC measurement for power will equal the AC power consumption. Furthermore, even without the target AC circuit being in exact balance, the temperature difference between the heat exchange units can provide an accurate measurement of the power difference and power dissipation. This allows faster results of thermally slow systems, but also accurate measurements on a time-varying or periodic power dissipation. Since DC power may be accurately determined, the inventive approach will provide an accurate power value of the target AC circuit, even though it is not a DC circuit and the energy source is not a DC power source.

Accordingly, a first aspect of the present invention is an apparatus for determining a power value of a target in the form of an AC circuit having an AC power source. The apparatus comprises a DC circuit with a controllable DC power source, electric measuring means for measuring at least one electric parameter of the DC circuit, at least one heat sink which is thermally coupled between the DC circuit and the target AC circuit, thermo-sensory means for measuring at least one thermal parameter related to power dissipation (e.g. heat dissipation, heat flow, temperature) of the DC circuit and of the target AC circuit, and a balancing unit. The balancing unit has an input operatively connected to the electric measuring means, at least one input operatively connected to the thermo-sensory means, and an output coupled to the controllable DC power source.

The balancing unit is configured to control the controllable DC power source based on the at least one thermal parameter measured by the thermo-sensory means to reduce a difference in power dissipation (e.g. heat dissipation, heat flow, temperature) between the DC circuit and the target AC circuit. When thermal equilibrium is reached, the balancing unit is configured to determine the power value of the target AC circuit by retrieving at least one real-time measurement of the at least one electric parameter of the DC circuit from the electric measuring means, calculating a DC power value of the DC circuit based on the retrieved at least one real-time measurement of the at least one electric parameter, and calculating the power value of the target AC circuit using the calculated DC power value.

In some embodiments, the balancing unit is configured to decide that thermal equilibrium is reached when the thermo-sensory means indicates that the difference in power dissipation between the DC circuit and the target AC circuit is less than a threshold value. In other embodiments, the balancing unit is configured to decide that thermal equilibrium is reached when the thermo-sensory means indicates that the difference in power dissipation between the DC circuit and the target AC circuit changes by less than a threshold rate.

Generally, thermal equilibrium may be defined as an abstract state that a thermal model can reside in. One simple example of thermal equilibrium is when the heat flux (heat flow) into an object is equal to the heat flux out of the object (and as a result there is no change in the temperature anymore despite the heat flux). However, the present inventors also envision scenarios where a time-varying or periodic signal is to be measured that changes faster than the thermal time constant of the invention. In such situations, thermal equilibrium could be defined as a minimum change in temperature over a minimum duration in time. Other definitions of thermal equilibrium are not excluded from this invention. Hence, thermal equilibrium may not necessarily mean that the temperature is stable and/or the temperature difference is very small.

A second aspect of the present invention is a method of determining a power value of a target in the form of an AC circuit having an AC power source. The method involves operating a controllable DC power source to provide DC power to a DC circuit and measuring at least one thermal parameter related to power dissipation (e.g. heat dissipation, heat flow, temperature) of the DC circuit and of the target AC circuit, wherein at least one heat sink is thermally coupled between the DC circuit and the target AC circuit. The method also involves controlling the DC power source based on the measured at least one thermal parameter to reduce a difference in power dissipation (e.g. heat dissipation, heat flow, temperature) between the DC circuit and the target AC circuit.

The method further involves, when thermal equilibrium is reached, determining the power value of the target AC circuit by retrieving at least one real-time measurement of at least one electric parameter of the DC circuit, calculating a DC power value of the DC circuit based on the retrieved at least one real-time measurement of the at least one electric parameter, and calculating the power value of the target AC circuit using the calculated DC power value.

The method according to the second aspect may further involve any or all of the functionality performed by the apparatus according to the first aspect and its embodiments, as they are described throughout this document.

Other aspects of the invention and its embodiments are defined by the appended patent claims and are further explained in the detailed description section as well as on the drawings.

It should be emphasized that the term "comprises/comprising" when used in this specification is taken to specify the presence of stated features, integers, steps, or components, but does not preclude the presence or addition of one or more other features, integers, steps, components, or groups thereof. All terms used in the claims are to be interpreted according to their ordinary meaning in the technical field, unless explicitly defined otherwise herein. All references to "a/an/the [element, device, component, means, step, etc]" are to be interpreted openly as referring to at least one instance of the element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

Objects, features and advantages of embodiments of the invention will appear from the following detailed description, reference being made to the accompanying drawings.

DETAILED DESCRIPTION

Embodiments of the invention will now be described with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular embodiments illustrated in the accompanying drawings is not intended to be limiting of the invention. In the drawings, like numbers refer to like elements.

Figure 1:
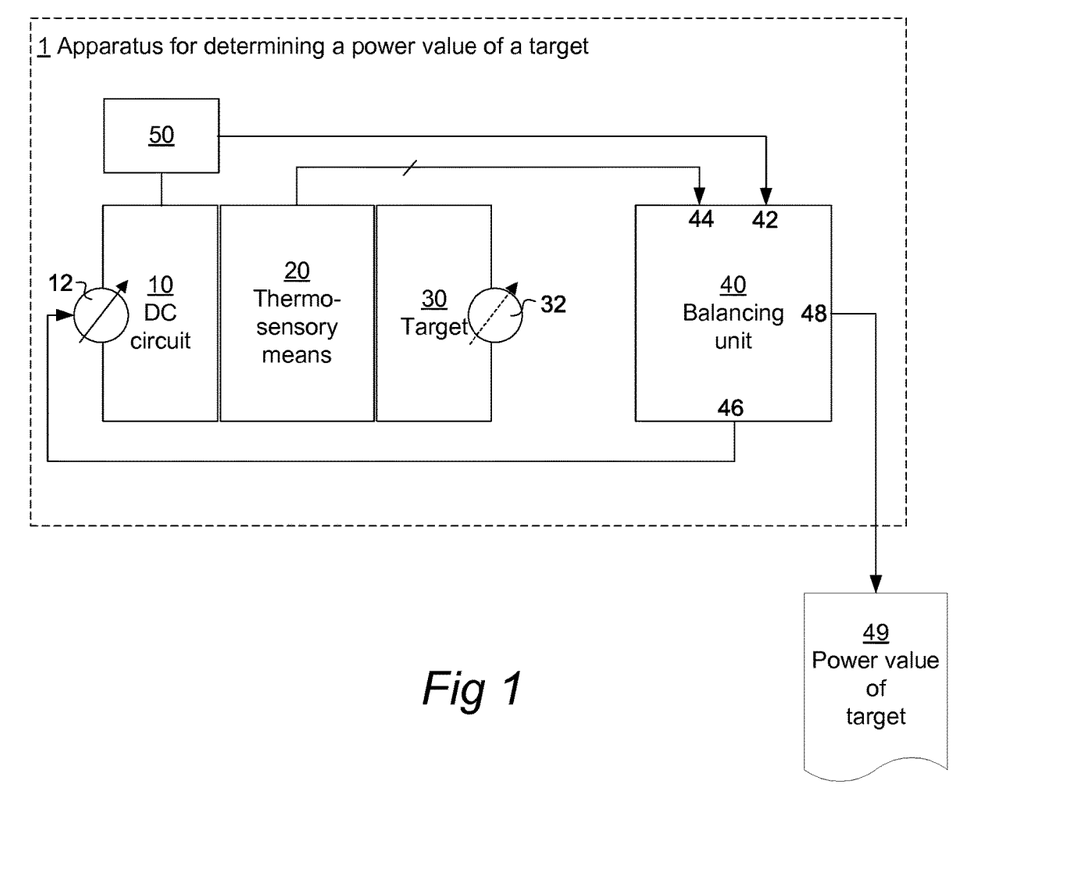
FIG. 1 is a schematic block diagram illustrating an apparatus for determining a power value of a target according to the present invention.

Reference is first made to FIG. 1, which is a schematic block diagram illustrating an apparatus 1 for determining a power value 49 of a target 30 according to the present invention. As will be described later with reference to the first, second and third embodiments seen in FIGS. 3, 4 and 5, the target 30 is an AC circuit having an AC power source. In alternative inventive aspects, not part of the presently claimed invention, the target 30 may, for instance, be an electromagnetic device for converting a magnetic field into electrical current, a photosensitive device for converting optical energy directly into heat, a collector/accumulator of solar energy, a mechanical damper for generating heat based on applied mechanical forces, a chemical reaction generating heat, or a pressure converter for converting pressure into heat.

The apparatus 1 comprises a DC circuit 10 with a controllable DC power source 12. The apparatus 1 also comprises electric measuring means 50 for measuring at least one electric parameter of the DC circuit, and thermo-sensory means 20 for measuring at least one thermal parameter related to power dissipation (e.g. heat dissipation, heat flow, temperature) of the DC circuit 10 and of the target AC circuit 30. As will be clear from FIGS. 3-5, at least one heat sink is thermally coupled between the DC circuit 10 and the target AC circuit 30 to improve the accuracy of the power dissipation measurements.

A balancing unit 40 of the apparatus 1 has an input 42 which is operatively connected to the electric measuring means 50, and at least one input 44 which is operatively connected to the thermo-sensory means 20. An output 46 of the balancing unit 40 is coupled to the controllable DC power source 12.

The balancing unit 40 is configured to control the controllable DC power source 12 based on the at least one thermal parameter measured by the thermo-sensory means 20 to reduce a difference in power dissipation (e.g. heat dissipation, heat flow, temperature) between the DC circuit 10 and the target AC circuit 30, preferably by starting at zero or very low initial DC power and increasing the DC power until thermal equilibrium is reached. The provision of the aforementioned at least one heat sink, which is thermally coupled between the DC circuit 10 and the target AC circuit 30, will improve the accuracy of the power dissipation measurements, in particular by isolating the measurement of the power dissipation of the DC circuit 10 from the measurement of the power dissipation of the target AC circuit 30.

When thermal equilibrium is reached, the balancing unit 40 is configured to determine the power value 49 of the target AC circuit 30 by retrieving at least one real-time measurement of the at least one electric parameter of the DC circuit 10 from the electric measuring means 50, then calculating a DC power value of the DC circuit 10 based on the retrieved real-time measurement(s) of the electric parameter(s), and finally calculating the power value 49 of the target AC circuit 30 using the calculated DC power value.

In some embodiments, the power value 49 of the target 30 may simply be set to the calculated DC power value. In other embodiments, for instance where the temperatures are not equal, which might happen with time-varying signals, or if the balance jumps between two smallest variations, the power value 49 of the target AC circuit 30 may be calculated as the average of, for instance, the two smallest variations. Other ways of calculating the power value 49 of the target AC circuit 30 using the calculated DC power value may also exist, as is readily realized by the skilled person.

The power value 49 thus determined may be presented, reported or otherwise made available to a user, operator, computer, etc, via an output 48 of the balancing unit 40, as is seen in FIG. 1.

Figure 2:
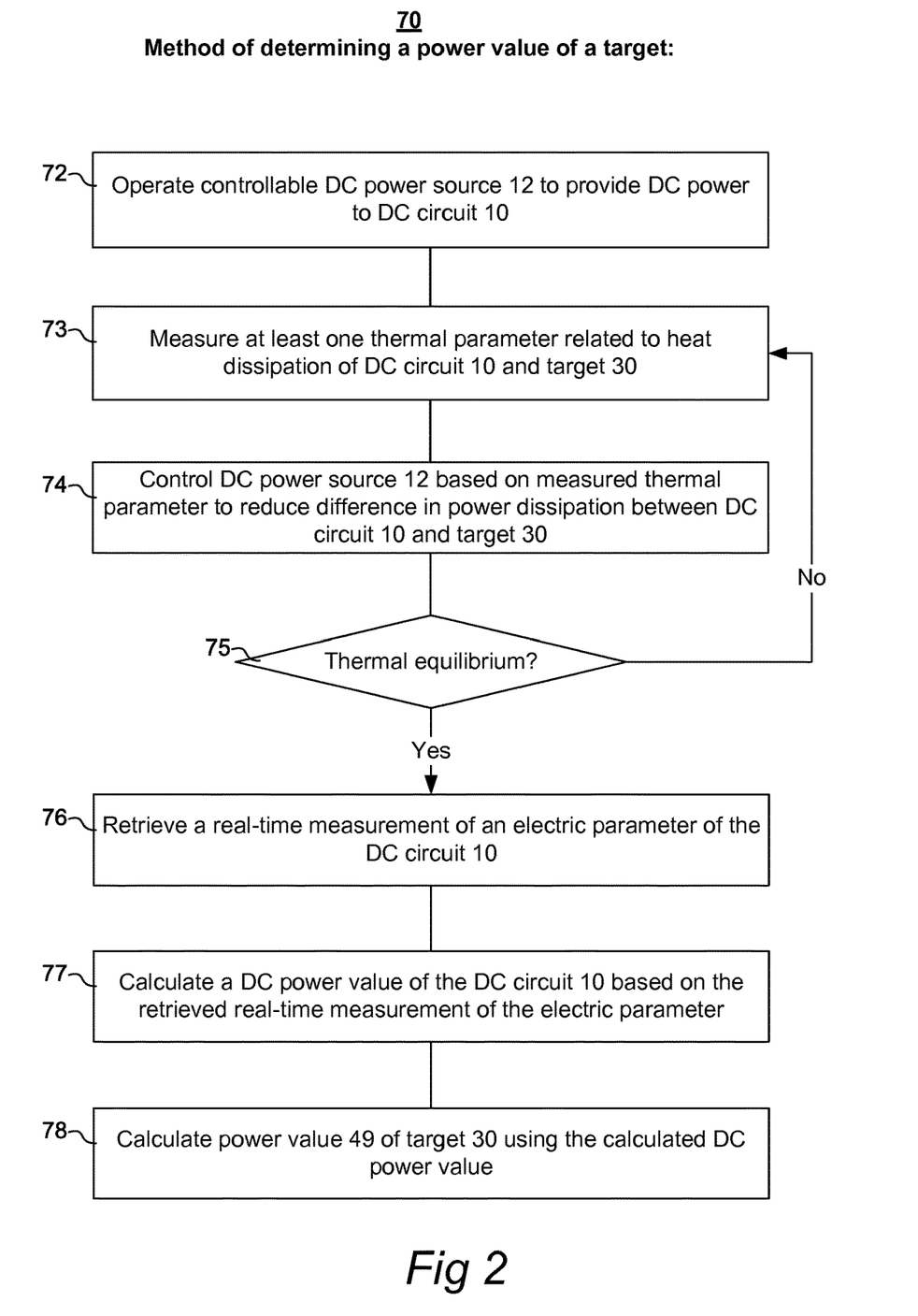
FIG. 2 is a schematic flowchart diagram illustrating a method of determining a power value of a target according to the present invention.

A corresponding method of determining the power value 49 of the target AC circuit 30 is seen at 70 in FIG. 2. The method 70 involves the following functionality.

As seen at 72, the controllable DC power source 12 is operated to provide DC power to the DC circuit 10. At least one thermal parameter related to power dissipation (e.g. heat dissipation, heat flow, temperature) of the DC circuit 10 and of the target AC circuit 30 is measured, as seen at 73. The DC power source 12 is controlled, as seen at 74, based on the measured at least one thermal parameter to reduce a difference in power dissipation (e.g. heat dissipation, heat flow, temperature) between the DC circuit 10 and the target AC circuit 30.

As seen at 75, it is checked whether thermal equilibrium has been reached. If not, the functionality in blocks 72-74 is continued.

When thermal equilibrium is reached, the power value 49 of the target AC circuit 30 is determined by retrieving, see 76, at least one real-time measurement of the at least one electric parameter of the DC circuit 10 from the electric measuring means 50, and calculating, see 77, a DC power value of the DC circuit 10 based on the retrieved at least one real-time measurement of the at least one electric parameter. As seen at 78, the power value 49 of the target AC circuit 30 is then calculated using the calculated DC power value.

The balancing unit 40 may be configured to decide that thermal equilibrium is reached (see 75 in FIG. 2) when the thermo-sensory means 20 (i.e., the measurements provided by it or them) indicate(s) that the difference in power dissipation between the DC circuit 10 and the target AC circuit 30 is less than a threshold value. The threshold value may be a zero value, or a suitably chosen low value, depending on implementation.

Alternatively, the balancing unit 40 may be configured to decide that thermal equilibrium is reached when the thermo-sensory means 20 (i.e., the measurements provided by it or them) indicate(s) that the difference in power dissipation between the DC circuit 10 and the target AC circuit 30 changes by less than a threshold rate over time. The threshold rate may be a zero rate (i.e. no change; steady state), or a suitably chosen low change rate, depending on implementation.

Advantageously, the DC circuit 10 may comprise a first resistor coupled to the DC power source 12. Such a first resistor is seen as $R_{DC}$ in FIGS. 3, 4 and 5. The thermo-sensory means 20 is adapted to measure at least one thermal parameter related to power dissipation in the first resistor $R_{DC}$.

Advantageously, the thermo-sensory means 20 may comprise a first set of temperature sensors positioned at respective positions on or at the first resistor $R_{DC}$ and adapted to measure the temperature at these respective positions. Such a first set of temperature sensors is seen at 221 in FIG. 4 and at 321 in FIG. 5. Advantageously, the thermo-sensory means 20 may furthermore comprise a second set of temperature sensors positioned at respective positions on or at the target AC circuit 30 and adapted to measure the temperature at these respective positions. Such a second set of temperature sensors is seen at 222 in FIG. 4 and at 322 in FIG. 5.

Advantageously, the thermo-sensory means 20 may comprise at least one heat flow sensor positioned between the DC circuit 10 and the target AC circuit 30. Such at least one heat flow sensor is seen at 120 in FIG. 3 and at 320a, 320b in FIG. 5. As will be clear from the subsequent description, heat flow sensor(s) may be used in combination with or instead of temperature sensors in different, non-limiting embodiments.

Figure 3:
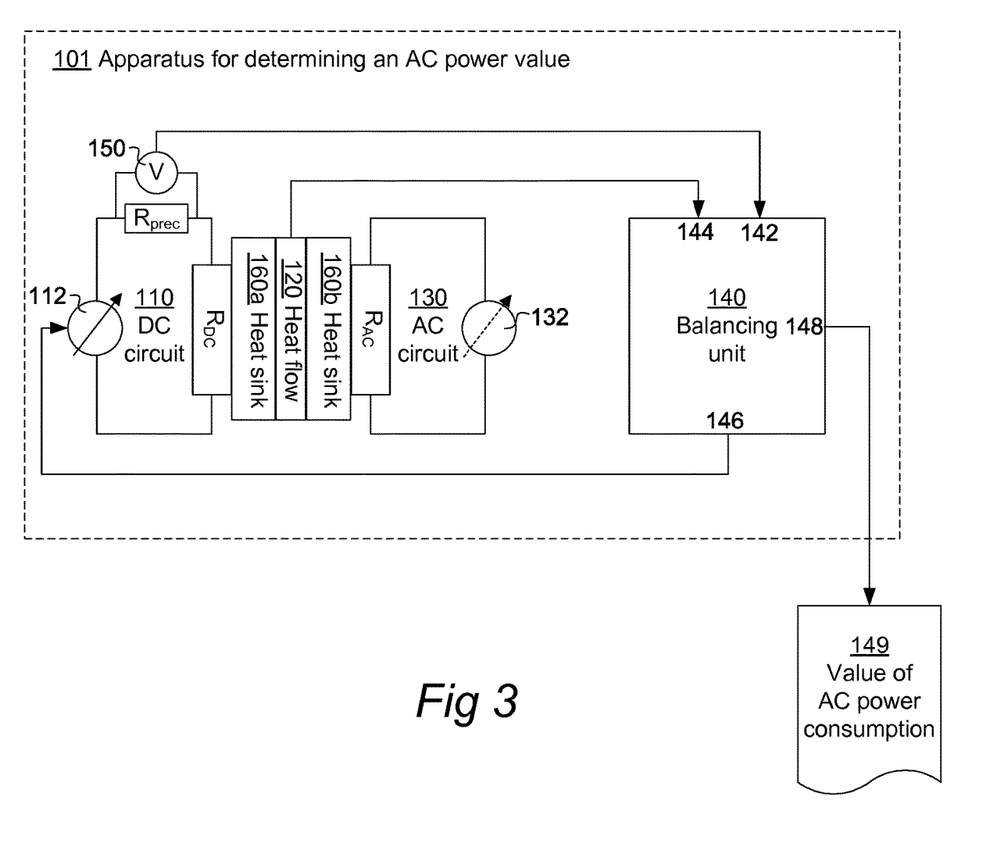
FIG. 3 is a schematic block diagram illustrating an apparatus for determining a power value of a target according to a first embodiment of the present invention.
Figure 4:
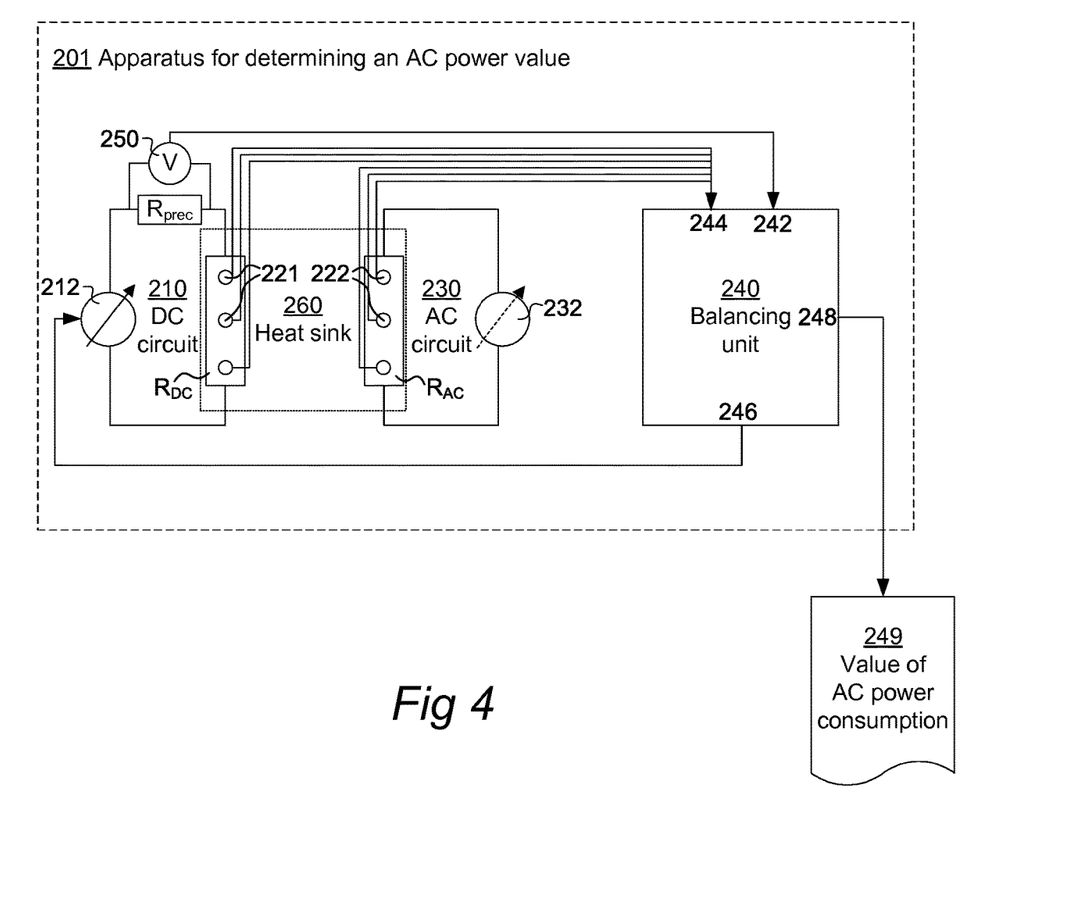
FIG. 4 is a schematic block diagram illustrating an apparatus for determining a power value of a target according to a second embodiment of the present invention.

As already mentioned, the apparatus 1 further comprises at least one heat sink which is thermally coupled between the DC circuit 10 and the target AC circuit 30. See FIG. 3, elements 160a and 160b; FIG. 4, element 260; and FIG. 5, element 360.

The target AC circuit 30 may advantageously comprise a second resistor coupled to the AC power source. Such a second resistor is seen as $R_{AC}$ in FIGS. 3, 4 and 5. The thermo-sensory means 20 is adapted to measure at least one thermal parameter related to power dissipation in the second resistor $R_{AC}$.

The first embodiment in FIG. 3 will now be described in more detail. Just like the general apparatus 1 in FIG. 1, the apparatus 101 in FIG. 3 is for determining a power value 149 of a target 130. More specifically, the target 130 is an AC circuit 130 having an AC power source 132, and the power value 149 to be determined is an AC power value 149. Generally, similar reference numerals nn (FIG. 1) and 1 nn (FIG. 3) represent the same, similar or at least corresponding elements, nn being integer numbers such as 10, 20, 30, etc.

The apparatus 101 comprises a DC circuit 110 with a controllable DC power source 112. The apparatus 101 also comprises electric measuring means 150 for measuring an electric parameter of the DC circuit. In the embodiment of FIG. 3, the electric measuring means 150 comprises a volt meter 150, such as a true RMS volt meter, coupled to measure the electric parameter of the DC circuit 110 as the voltage across a precision resistor $R_{prec}$. An output of the volt meter 150 is coupled to an input 142 of a balancing unit 140.

The apparatus 101 moreover comprises thermo-sensory means 120 for measuring at least one thermal parameter related to power dissipation of the DC circuit 110 and of the target AC circuit 130. The thermo-sensory means 120 in the embodiment of FIG. 3 comprises a heat flow sensor 120 positioned between a first heat sink 160a and a second heat sink 160b. The first heat sink 160a is thermally coupled to the first resistor $R_{DC}$ in the DC circuit 110, and the second heat sink 160b is thermally coupled to the second resistor $R_{AC}$ in the target AC circuit 130. The heat flow sensor 120 is adapted to measure the heat flow between the first and second heat sinks 160a, 160b and provide a thermal parameter in the form of the measured heat flow to an input 144 of the balancing unit 140. Preferably, the first and second resistors $R_{DC}$ and $R_{AC}$ are of identical type and have identical resistance values.

Like in the general apparatus 1 in FIG. 1, the balancing unit 140 in the apparatus 101 in FIG. 3 is configured to control the controllable DC power source 112 based on the at least one thermal parameter measured by the thermo-sensory means in the form of the heat flow sensor 120, so as to reduce the difference in power dissipation between the DC circuit 110 and the target AC circuit 130.

When thermal equilibrium is reached, the balancing unit 140 is configured to determine the power value 149 of the target AC circuit 130 by retrieving a real-time measurement of the electric parameter of the DC circuit 110 from the electric measuring means 150, in the form of the measured voltage across the precision resistor $R_{prec}$.

The balancing unit 140 then calculates a DC power value of the DC circuit 110 based on the retrieved real-time measurement of the voltage across the precision resistor $R_{prec}$ by using Ohm's law: DC power value=(measured voltage across the precision resistor $R_{prec}$)²/(resistance of precision resistor $R_{prec}$).

The balancing unit 140 then calculates the power value 149 of the target AC circuit 130 using the calculated DC power value, for instance by plainly setting the power value 149 of the target AC circuit 130 to the calculated DC power value.

The balancing unit 140 is configured to decide that thermal equilibrium is reached when the measured heat flow received from the heat flow sensor 120 on the input 144 indicates that there is no or a minimum of heat flow between the first resistor $R_{DC}$ and the second resistor $R_{AC}$.

As previously mentioned for FIG. 1, the determined power value 149 may be presented, reported or otherwise made available to a user, operator, computer, etc, via an output 148 of the balancing unit 140.

The second embodiment in FIG. 4 will now be described in more detail. Just like the general apparatus 1 in FIG. 1 and the apparatus 101 according to the first embodiment in FIG. 3, the apparatus 201 in FIG. 4 is for determining a power value 249 of a target 230, or more specifically an AC power value 249 of an AC circuit 230 having an AC power source 232. Except for the following differences, similar reference numerals 1 pp (FIG. 3) and 2 pp (FIG. 4) represent the same, similar or at least corresponding elements, pp being integer numbers.

Instead of the heat flow sensor 120 in FIG. 3, the apparatus 201 in FIG. 4 comprises thermo-sensory means in the form of a first set of temperature sensors 221 positioned at respective positions on or at the first resistor $R_{DC}$, and a second set of temperature sensors 222 positioned at respective positions on or at the second resistor $R_{AC}$. A common heat sink 260 is thermally coupled to the first resistor $R_{DC}$ in the DC circuit and to the second resistor $R_{AC}$ in the AC circuit. Each temperature sensor 221, 222 of the first and second sets of temperature sensors is adapted to measure the temperature at its respective position and provide a respective thermal parameter in the form of the measured temperature to an input 244 of the balancing unit 240.

The balancing unit 240 in the apparatus 201 in FIG. 4 is configured to control the controllable DC power source 212 based on the temperatures measured by the first and second sets of temperature sensors 221, 222, so as to reduce the difference in power dissipation (i.e. temperature) between the DC circuit 210 and the target AC circuit 230.

Figure 6:
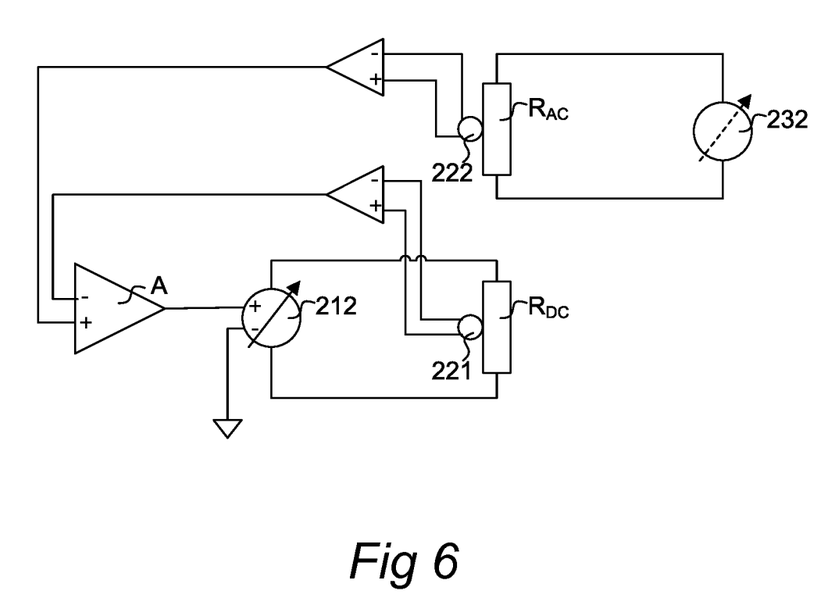
FIG. 6 is a schematic electric circuit diagram which will facilitate an understanding of the invention from an electrical perspective.

A simplified electrical circuit diagram is shown in FIG. 6. For simplicity, the electrical circuit diagram does not contain practical design aspects such as filtering, hysteresis, saturation, limitation, etc. It is to be understood that such additions would not limit, or circumvent, the invention in any way. Here, the first set of temperature sensors 221 are indicated as a single temperature sensor 221 (which may represent an average value of the first set of temperature sensors 221), and correspondingly for the second set of temperature sensors 222. The measurement signals from the first and second sets of temperature sensors 221, 222 provide direct feedback to an amplifier A which is implemented by the balancing unit 240 and controls the DC power source 212 and hence the power dissipation in the first resistor $R_{DC}$.

In the (simplified) configuration of FIG. 6, the circuit aims to keep the temperatures of 221 and 222 equal by changing the power dissipation in the first resistor $R_{DC}$.

With the resistance of the first resistor $R_{DC}$ known, the voltage across it can be used to calculate the power dissipation on the DC side. With the knowledge that equal temperatures of 221 and 222 mean equal power dissipation in the first resistor $R_{DC}$ and second resistor $R_{AC}$, the AC power value 249 of the AC circuit 230 may be determined with the accuracy of the DC measurement in the DC circuit 210.

In this embodiment, the balancing unit 240 is configured to decide that thermal equilibrium is reached when the measured temperatures received from the first and second sets of temperature sensors 221, 222 indicate that there is no or a minimum of temperature difference between the first resistor RDC and the second resistor RAC.

As previously mentioned for FIGS. 1 and 3, the determined power value 249 may be presented, reported or otherwise made available to a user, operator, computer, etc, via an output 248 of the balancing unit 240.

Figure 5:
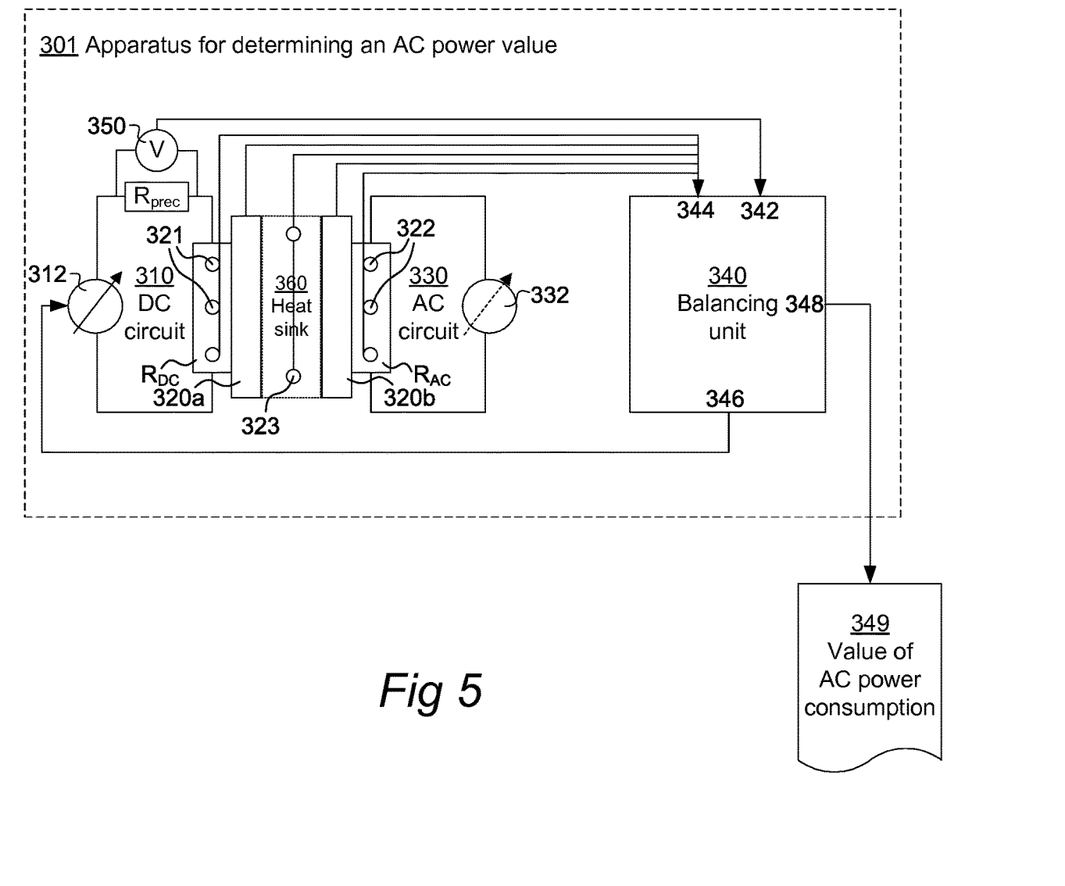
FIG. 5 is a schematic block diagram illustrating an apparatus for determining a power value of a target according to a third embodiment of the present invention.

The third embodiment in FIG. 5 will now be described in more detail. Just like the general apparatus 1 in FIG. 1, the apparatus 101 according to the first embodiment in FIG. 3 and the apparatus 201 according to the second embodiment in FIG. 4, the apparatus 301 in FIG. 5 is for determining a power value 349 of a target 330, or more specifically an AC power value 349 of an AC circuit 330 having an AC power source 332. Except for the following differences, similar reference numerals 1 qq/2 qq (FIG. 3/FIG. 4) and 3 qq (FIG. 5) represent the same, similar or at least corresponding elements, qq being integer numbers.

The apparatus 301 in FIG. 5 comprises thermo-sensory means in the form of a first heat flow sensor 320a positioned between the first resistor $R_{DC}$ and a common heat sink 360, a second heat flow sensor 320b positioned between the common heat sink 360 and the second resistor $R_{AC}$, a first set of temperature sensors 321 positioned at respective positions on or at the first resistor $R_{DC}$, and a second set of temperature sensors 322 positioned at respective positions on or at the second resistor $R_{AC}$. The common heat sink 360 is positioned between the first resistor $R_{DC}$ in the DC circuit 310 and the second resistor $R_{AC}$ in the target AC circuit 330, and is thermally coupled to the first and second heat flow sensors 320a, 320b.

The first heat flow sensor 320a is adapted to measure the heat flow between the first resistor $R_{DC}$ and the common heat sink 360 and provide a first thermal parameter in the form of the measured heat flow to an input 344 of the balancing unit 340. The second heat flow sensor 320b is correspondingly adapted to measure the heat flow between the common heat sink 360 and the second resistor $R_{AC}$ and provide a second thermal parameter in the form of the measured heat flow to the input 344 (or another input) of the balancing unit 340. Moreover, each temperature sensor of the first and second sets of temperature sensors 321, 322 is adapted to measure the temperature at its respective position and provide a respective thermal parameter in the form of the measured temperature to the input 344 (or another input) of the balancing unit 340.

The balancing unit 340 in the apparatus 301 in FIG. 5 is configured to control the controllable DC power source 312 based on the temperatures measured by the first and second sets of temperature sensors 321, 322 and the measured heat flow received from the first and second heat flow sensors 320a, 320b, so as to reduce the differences in heat flow between the DC circuit 310 and the target AC circuit 330.

In this embodiment, the balancing unit 340 is configured to decide that thermal equilibrium is reached when the measured temperatures received from the first and second sets of temperature sensors 321, 322 indicate that there is no or a minimum of temperature difference between the first resistor $R_{DC}$ and the second resistor $R_{AC}$, and/or when the measured heat flow received from the first and second heat flow sensors 320a, 320b indicates that there is no or a minimum of heat flow between the first resistor $R_{DC}$ and the second resistor $R_{AC}$.

When thermal equilibrium is reached, the balancing unit 340 is configured to determine the power value 349 of the target AC circuit 330 by retrieving a real-time measurement of the electric parameter of the DC circuit 310 from the electric measuring means 350, in the form of the measured voltage across the precision resistor $R_{prec}$.

The balancing unit 340 then calculates a DC power value of the DC circuit 310 based on the retrieved real-time measurement of the voltage across the precision resistor $R_{prec}$ by using Ohm's law, as previously described. The balancing unit 340 then sets the power value 349 of the target AC circuit 330 to the calculated DC power value, or otherwise uses the calculated DC power value to calculate the power value 349 of the target AC circuit 330, as previously explained.

As previously mentioned for FIGS. 1, 3 and 4, the determined power value 349 may be presented, reported or otherwise made available to a user, operator, computer, etc, via an output 348 of the balancing unit 340.

Advantageously but optionally, the third embodiment in FIG. 5 may moreover have a third set of temperature sensors 323 positioned at respective positions on or at the common heat sink 360. Each such temperature sensor of the third set of temperature sensors 323 is adapted to measure the temperature at a respective position and provide a respective thermal parameter in the form of the measured temperature to the balancing unit 340.

The balancing unit 340 may be configured to use the temperatures measured by the third set of temperature sensors 323 in order to validate, or verify, the heat flows measured by the first and second heat flow sensors 320a, 320b. Additionally or alternatively, the balancing unit 340 may be configured to use the temperatures measured by the third set of temperature sensors 323 in order to validate, or verify, the temperatures measured by the first and second sets of temperature sensors 321, 322. Still additionally or alternatively, the balancing unit 340 may be configured to use the temperatures measured by the third set of temperature sensors 323 in order to control a cooling unit (not shown in FIG. 5) for providing cooling of the common heat sink 360. This may assist in keeping the first and second sets of temperature sensors 321, 322 in their intended operating ranges, thereby increasing the opportunities of obtaining accurate temperature readings.

In any of the embodiments of the invention, the temperature sensors may, for instance, be K-type or E-type thermocouples. To increase the output gain, the thermocouples may be added in series, where the output voltage is a scaled version of the actual temperature.

In any of the embodiments of the invention, the heat flux sensors may, for instance, be of the type gSKIN® Heat Flux Sensor by greenTEG, Technoparkstr. 1, CH-8005, Zürich, Switzerland.

In any of the embodiments of the invention, the balancing unit may be implemented as a computerized system comprising a central processing unit (CPU), digital signal processor (DSP), application-specific integrated circuit (ASIC), field-programmable gate array (FPGA), or generally by any electronic circuitry capable of performing the functionalities as described herein, together with interfaces (such as ADC converters), supply circuitry, protective circuitry, filters, memories, etc, as appropriate.

Alternative inventive aspects are defined in the following numbered clauses.

I. An apparatus (1) for determining a power value (49) of a target (30), comprising:
a DC circuit (10) comprising a controllable DC power source (12);
electric measuring means (50) for measuring at least one electric parameter of the DC circuit;
thermo-sensory means (20) for measuring at least one thermal parameter related to power dissipation of the DC circuit (10) and of the target (30); and
a balancing unit (40) having:
an input (42) operatively connected to the electric measuring means (50);
at least one input (44) operatively connected to the thermo-sensory means (20); and an output (46) coupled to the controllable DC power source (12), wherein the balancing unit (40) is configured to:

control the controllable DC power source (12) based on the at least one thermal parameter measured by the thermo-sensory means (20) to reduce a difference in power dissipation between the DC circuit (10) and the target (30); and when thermal equilibrium is reached, determine the power value (49) of the target (30) by retrieving at least one real-time measurement of the at least one electric parameter of the DC circuit (10) from the electric measuring means (50), calculating a DC power value of the DC circuit (10) based on the retrieved at least one real-time measurement of the at least one electric parameter, and calculating the power value (49) of the target (30) using the calculated DC power value.

II. The apparatus as defined in clause 1, wherein the target (30) is any of the following:

an AC circuit (130; 230; 330) having an AC power source (132; 232; 332);

an electromagnetic device for converting an alternating magnetic field into electrical current;

a photosensitive device for converting optical energy directly into heat;

a collector/accumulator of solar energy;

a mechanical damper for generating heat based on applied mechanical forces;

a chemical reaction generating heat; and a pressure converter for converting pressure into heat.

III. The apparatus as defined in clause I or II, wherein the balancing unit (40) is configured to decide that thermal equilibrium is reached when the thermo-sensory means (20) indicates that the difference in power dissipation between the DC circuit (10) and the target (30) is less than a threshold value.

IV. The apparatus as defined in clause I or II, wherein the balancing unit (40) is configured to decide that thermal equilibrium is reached when the thermo-sensory means (20) indicates that the difference in power dissipation between the DC circuit (10) and the target (30) changes by less than a threshold rate.

V. The apparatus as defined in any preceding clause, wherein:

the DC circuit (10; 110; 210; 310) comprises a first resistor (RDC) coupled to the DC power source (12; 112; 212; 312), wherein the thermo-sensory means (20; 120; 221; 321, 320a) is adapted to measure at least one thermal parameter related to power dissipation in said first resistor (RDC).

VI. The apparatus as defined in clause V, wherein the thermo-sensory means comprises a first set of temperature sensors (221; 321) positioned at respective positions on or at the first resistor (RDC) and adapted to measure the temperature at said respective positions, and wherein the thermo-sensory means furthermore comprises a second set of temperature sensors (222; 322) positioned at respective positions on or at the target (30; 230; 330) and adapted to measure the temperature at said respective positions.

VII. The apparatus as defined in any preceding clause, wherein the thermo-sensory means comprises at least one heat flow sensor (120; 320a, 320b) positioned between the DC circuit (10; 110; 310) and the target (30; 130; 330).

VIII. The apparatus as defined in any preceding clause, further comprising at least one heat sink (160a, 160b; 260; 360) thermally coupled between the DC circuit (10; 110; 310) and the target (30; 130; 330).

IX. The apparatus as defined in any preceding clause, wherein:

the target (30) is an AC circuit (130; 230; 330) having an AC power source (132; 232; 332); and the AC circuit (30; 130; 230; 330) comprises a second resistor (RAC) coupled to the AC power source (32; 132; 232; 332), wherein the thermo-sensory means (20; 120; 222; 322, 320b) is adapted to measure at least one thermal parameter related to power dissipation in said second resistor (RAC).

X. The apparatus as defined in clause IX, further comprising:

a first heat sink (160a) thermally coupled to the first resistor (RDC) in the DC circuit; and a second heat sink (160b) thermally coupled to the second resistor (RAC) in the AC circuit, wherein the thermo-sensory means comprises a heat flow sensor (120) positioned between the first heat sink (160a) and the second heat sink (160b), said heat flow sensor (120) being adapted to measure the heat flow between the first and second heat sinks and provide a thermal parameter in the form of the measured heat flow to the balancing unit (140).

XI. The apparatus as defined in clause X, wherein the balancing unit (140) is configured to decide that thermal equilibrium is reached when the measured heat flow received from the heat flow sensor (120) indicates that there is no or a minimum of heat flow between the first resistor (RDC) and the second resistor (RAC).

XII. The apparatus as defined in clause IX, further comprising:

a common heat sink (260) thermally coupled to the first resistor (RDC) in the DC circuit and to the second resistor (RAC) in the AC circuit, wherein the thermo-sensory means comprises:

a first set of temperature sensors (221) positioned at respective positions on or at the first resistor (RDC); and a second set of temperature sensors (222) positioned at respective positions on or at the second resistor (RAC), each temperature sensor of said first and second sets of temperature sensors being adapted to measure the temperature at a respective one of said positions and provide a respective thermal parameter in the form of the measured temperature to the balancing unit (240).

XIII. The apparatus as defined in clause XII, wherein the balancing unit (240) is configured to decide that thermal equilibrium is reached when the measured temperatures received from the first and second sets of temperature sensors (221, 222) indicate that there is no or a minimum of temperature difference between the first resistor (RDC) and the second resistor (RAC).

XIV. The apparatus as defined in clause IX, further comprising:

a common heat sink (360) positioned between the first resistor (RDC) in the DC circuit and the second resistor (RAC) in the AC circuit, wherein the thermo-sensory means comprises:

a first heat flow sensor (320a) positioned between the first resistor (RDC) and the common heat sink (360);

a second heat flow sensor (320b) positioned between the common heat sink (360) and the second resistor (RAC);

a first set of temperature sensors (321) positioned at respective positions on or at the first resistor (RDC); and a second set of temperature sensors (322) positioned at respective positions on or at the second resistor (RAC), said first heat flow sensor (320a) being adapted to measure the heat flow between the first resistor (RDC) and the common heat sink (360) and provide a first thermal parameter in the form of the measured heat flow to the balancing unit (340), said second heat flow sensor (320b) being adapted to measure the heat flow between the common heat sink (360) and the second resistor (RAC) and provide a second thermal parameter in the form of the measured heat flow to the balancing unit (340), and each temperature sensor of said first and second sets of temperature sensors (321, 322) being adapted to measure the temperature at a respective one of said positions and provide a respective thermal parameter in the form of the measured temperature to the balancing unit (340).

XV. The apparatus as defined in clause XIV, wherein the balancing unit (340) is configured to decide that thermal equilibrium is reached when the measured temperatures received from the first and second sets of temperature sensors (321, 322) indicate that there is no or a minimum of temperature difference between the first resistor (RDC) and the second resistor (RAC), and/or when the measured heat flow received from the first and second heat flow sensors (320a, 320b) indicates that there is no or a minimum of heat flow between the first resistor (RDC) and the second resistor (RAC).

XVI. The apparatus as defined in clause XV, further comprising:

a third set of temperature sensors (323) positioned at respective positions on or at the common heat sink (360), each temperature sensor of said third set of temperature sensors being adapted to measure the temperature at a respective one of said positions and provide a respective thermal parameter in the form of the measured temperature to the balancing unit (340).

XVII. The apparatus as defined in clause XVI, wherein the balancing unit (340) is configured to use the temperatures measured by the third set of temperature sensors (323) for at least one of the following:

a) to validate the heat flows measured by the first and second heat flow sensors (320a, 320b);

b) to validate the temperatures measured by the first and second sets of temperature sensors (321, 322); and c) to control a cooling unit for providing cooling of the common heat sink (360).

XVIII. The apparatus as defined in any of the preceding clauses, wherein the DC circuit (10) comprises a precision resistor (Rprec) with a known resistance value, and wherein the electric measuring means (50) comprises a volt meter (150; 250; 350) for measuring the at least one electric parameter in the form of a voltage across the precision resistor (Rprec).

XIX. A method (70) of determining a power value (49) of a target (30), involving:

operating (72) a controllable DC power source (12) to provide DC power to a DC circuit (10);

measuring (73) at least one thermal parameter related to power dissipation of the DC circuit (10) and of the target (30);

controlling (74) the DC power source (12) based on the measured at least one thermal parameter to reduce a difference in power dissipation between the DC circuit (10) and the target (30); and when thermal equilibrium is reached (75), determining the power value (49) of the target (30) by:

retrieving (76) at least one real-time measurement of at least one electric parameter of the DC circuit (10);

calculating (77) a DC power value of the DC circuit (10) based on the retrieved at least one real-time measurement of the at least one electric parameter; and calculating (78) the power value (49) of the target (30) using the calculated DC power value.

The invention has been described above in detail with reference to embodiments thereof. However, as is readily understood by those skilled in the art, other embodiments are equally possible within the scope of the present invention, as defined by the appended claims.

What is claimed is:

1. An apparatus for determining a power value of a target in the form of an AC circuit having an AC power source, the apparatus comprising:
    a DC circuit comprising a controllable DC power source;
    electric measuring means for measuring at least one electric parameter of the DC circuit;
    at least one heat sink thermally coupled between the DC circuit and the target AC circuit;
    thermo-sensory means for measuring at least one thermal parameter related to power dissipation of the DC circuit and of the target AC circuit; and
    a balancing unit having:
        an input operatively connected to the electric measuring means
        at least one input operatively connected to the thermo-sensory means; and
        an output coupled to the controllable DC power source, wherein the balancing unit is configured to:
            control the controllable DC power source based on the at least one thermal parameter measured by the thermo-sensory means to reduce a difference in power dissipation between the DC circuit and the target AC circuit; and
            when thermal equilibrium is reached, determine the power value of the target AC circuit by retrieving at least one real-time measurement of the at least one electric parameter of the DC circuit from the electric measuring means, calculating a DC power value of the DC circuit based on the retrieved at least one real-time measurement of the at least one electric parameter, and calculating the power value of the target AC circuit using the calculated DC power value.

2. The apparatus as defined in claim 1, wherein the balancing unit is configured to decide that thermal equilibrium is reached when the thermo-sensory means indicates that the difference in power dissipation between the DC circuit and the target AC circuit is less than a threshold value.

3. The apparatus as defined in claim 1, wherein the balancing unit is configured to decide that thermal equilibrium is reached when the thermo-sensory means indicates that the difference in power dissipation between the DC circuit and the target AC circuit changes by less than a threshold rate.

4. The apparatus as defined in claim 1, wherein:
    the DC circuit comprises a first resistor coupled to the DC power source, wherein the thermo-sensory means is adapted to measure at least one thermal parameter related to power dissipation in said first resistor.

5. The apparatus as defined in claim 4, wherein the thermo-sensory means comprises a first set of temperature sensors positioned at respective positions on or at the first resistor and adapted to measure the temperature at said respective positions, and wherein the thermo-sensory means furthermore comprises a second set of temperature sensors positioned at respective positions on or at the target AC circuit and adapted to measure the temperature at said respective positions.

6. The apparatus as defined in claim 1, wherein the thermo-sensory means comprises at least one heat flow sensor positioned between the DC circuit and the target AC circuit.

7. The apparatus as defined in claim 1, wherein:
the target AC circuit comprises a second resistor coupled to the AC power source, wherein the thermo-sensory means is adapted to measure at least one thermal parameter related to power dissipation in said second resistor.

8. The apparatus as defined in claim 7,
wherein said at least one heat sink comprises:
a first heat sink thermally coupled to the first resistor in the DC circuit, and
a second heat sink thermally coupled to the second resistor in the AC circuit, and
wherein the thermo-sensory means comprises:
a heat flow sensor positioned between the first heat sink and the second heat sink, said heat flow sensor being adapted to measure the heat flow between the first and second heat sinks and provide a thermal parameter in the form of the measured heat flow to the balancing unit.

9. The apparatus as defined in claim 8, wherein the balancing unit is configured to decide that thermal equilibrium is reached when the measured heat flow received from the heat flow sensor indicates that there is no or a minimum of heat flow between the first resistor and the second resistor.

10. The apparatus as defined in claim 7,
wherein said at least one heat sink comprises:
a common heat sink thermally coupled to the first resistor in the DC circuit and to the second resistor in the AC circuit, and
wherein the thermo-sensory means comprises:
a first set of temperature sensors positioned at respective positions on or at the first resistor; and
a second set of temperature sensors positioned at respective positions on or at the second resistor,
each temperature sensor of said first and second sets of temperature sensors being adapted to measure the temperature at a respective one of said positions and provide a respective thermal parameter in the form of the measured temperature to the balancing unit.

11. The apparatus as defined in claim 10, wherein the balancing unit is configured to decide that thermal equilibrium is reached when the measured temperatures received from the first and second sets of temperature sensors indicate that there is no or a minimum of temperature difference between the first resistor and the second resistor.

12. The apparatus as defined in claim 7,
wherein said at least one heat sink comprises:
a common heat sink positioned between the first resistor in the DC circuit and the second resistor in the AC circuit, and
wherein the thermo-sensory means comprises:
a first heat flow sensor positioned between the first resistor and the common heat sink;
a second heat flow sensor positioned between the common heat sink and the second resistor;
a first set of temperature sensors positioned at respective positions on or at the first resistor; and
a second set of temperature sensors positioned at respective positions on or at the second resistor,
said first heat flow sensor being adapted to measure the heat flow between the first resistor and the common heat sink and provide a first thermal parameter in the form of the measured heat flow to the balancing unit,
said second heat flow sensor being adapted to measure the heat flow between the common heat sink and the second resistor and provide a second thermal parameter in the form of the measured heat flow to the balancing unit, and
each temperature sensor of said first and second sets of temperature sensors being adapted to measure the temperature at a respective one of said positions and provide a respective thermal parameter in the form of the measured temperature to the balancing unit.

13. The apparatus as defined in claim 12, wherein the balancing unit is configured to decide that thermal equilibrium is reached when the measured temperatures received from the first and second sets of temperature sensors indicate that there is no or a minimum of temperature difference between the first resistor and the second resistor, and/or when the measured heat flow received from the first and second heat flow sensors indicates that there is no or a minimum of heat flow between the first resistor and the second resistor.

14. The apparatus as defined in claim 13, further comprising:
a third set of temperature sensors positioned at respective positions on or at the common heat sink, each temperature sensor of said third set of temperature sensors being adapted to measure the temperature at a respective one of said positions and provide a respective thermal parameter in the form of the measured temperature to the balancing unit.

15. The apparatus as defined in claim 14, wherein the balancing unit is configured to use the temperatures measured by the third set of temperature sensors for at least one of the following:
a) to validate the heat flows measured by the first and second heat flow sensors;
b) to validate the temperatures measured by the first and second sets of temperature sensors; and
c) to control a cooling unit for providing cooling of the common heat sink.

16. The apparatus as defined in claim 1,
wherein the DC circuit comprises a precision resistor with a known resistance value, and
wherein the electric measuring means comprises a volt meter for measuring the at least one electric parameter in the form of a voltage across the precision resistor.

17. A method of determining a power value of a target in the form of an AC circuit having an AC power source, the method involving:
operating a controllable DC power source to provide DC power to a DC;
measuring at least one thermal parameter related to power dissipation of the DC circuit and of the target AC circuit, at least one heat sink being thermally coupled between the DC circuit and the target AC circuit;
controlling the DC power source based on the measured at least one thermal parameter to reduce a difference in power dissipation between the DC circuit and the target AC circuit; and
when thermal equilibrium is reached, determining the power value of the target AC circuit by:
retrieving at least one real-time measurement of at least one electric parameter of the DC circuit;

calculating a DC power value of the DC circuit based on the retrieved at least one real-time measurement of the at least one electric parameter; and calculating the power value of the target AC circuit using the calculated DC power value.

* * * * *